United States Patent
Yap et al.

(10) Patent No.: US 9,312,206 B2
(45) Date of Patent: Apr. 12, 2016

(54) SEMICONDUCTOR PACKAGE WITH THERMAL VIA AND METHOD FOR FABRICATION THEREOF

(71) Applicant: FREESCALE SEMICONDUCTOR, INC., Austin, TX (US)

(72) Inventors: Weng F. Yap, Chandler, AZ (US); Scott M. Hayes, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 65 days.

(21) Appl. No.: 14/196,557

(22) Filed: Mar. 4, 2014

(65) Prior Publication Data

US 2015/0255371 A1    Sep. 10, 2015

(51) Int. Cl.
*H01L 21/768* (2006.01)
*H01L 23/48* (2006.01)
*H01L 23/373* (2006.01)
*H01L 23/00* (2006.01)

(52) U.S. Cl.
CPC ........ *H01L 23/481* (2013.01); *H01L 21/76883* (2013.01); *H01L 23/373* (2013.01); *H01L 24/06* (2013.01); *H01L 24/19* (2013.01); *H01L 2224/0612* (2013.01); *H01L 2924/181* (2013.01)

(58) Field of Classification Search
CPC ...... H01L 23/373; H01L 23/481; H01L 24/06
USPC ......................................................... 257/666
See application file for complete search history.

(56) References Cited

U.S. PATENT DOCUMENTS

| | | |
|---|---|---|
| 7,446,422 B1 * | 11/2008 | Paek et al. ..................... 257/779 |
| 7,528,069 B2 | 5/2009 | Wenzel et al. |
| 8,236,609 B2 | 8/2012 | Ramanathan et al. |
| 8,283,780 B2 | 10/2012 | Lo et al. |
| 2010/0148357 A1 | 6/2010 | Yang et al. |
| 2012/0133039 A1 * | 5/2012 | Pruvost et al. ................ 257/706 |
| 2013/0087914 A1 * | 4/2013 | Yang et al. .................... 257/738 |
| 2014/0015106 A1 | 1/2014 | Hsieh et al. |

* cited by examiner

*Primary Examiner* — Matthew W Such
*Assistant Examiner* — Warren H Kilpatrick
(74) *Attorney, Agent, or Firm* — Charlene R. Jacobsen

(57) ABSTRACT

A semiconductor package includes a semiconductor die having an active face and dielectric layers disposed on the active face of the semiconductor die. At least one opening is formed through the dielectric layers and extends from a non-bond pad area of the active face to an exterior surface of the dielectric layers. An electrically conductive layer is formed in the opening and is in physical contact with the active face of the semiconductor die. A thermally conductive material fills the opening to form a thermal via for dissipating heat away from the semiconductor die.

12 Claims, 7 Drawing Sheets

20

50

SEMICONDUCTOR PACKAGE WITH THERMAL VIA AND METHOD FOR FABRICATION THEREOF

TECHNICAL FIELD OF THE INVENTION

The present invention relates generally to semiconductor packages. More specifically, the present invention relates to effective heat dissipation for a semiconductor package.

BACKGROUND OF THE INVENTION

Semiconductor device packaging fulfills basic functions such as providing electrical connections and protecting the semiconductor die against mechanical and environmental stresses. Continued progress in reduction of the size of the semiconductor dies and increased functionality and complexity of the circuits integrated in the semiconductor dies also require size reduction of the packaging with the same or greater complexity of the electrical connections with external circuits.

Semiconductor devices are commonly packaged for surface mounting by encapsulating one or more semiconductor dies with a mold compound. Electrical contacts for connection with external circuits are exposed at an exterior surface of the semiconductor package and are connected internally with electrical contact pads on the semiconductor die. Various techniques are available for connecting the exposed electrical contacts of the semiconductor package internally with the embedded semiconductor die.

One technique for connecting the exposed electrical contacts with the electrical contact pads on the semiconductor die entails temporarily placing singulated semiconductor dies with their active face on a substrate. The dies are embedded with a molding compound into a panel and then released from the substrate. The contact pads on the semiconductor die surfaces are then connected to exposed pads on the exterior surface of the package panel by a redistribution process to route out the signal connections, and the power and ground connections. The redistribution process includes deposition of a plurality of electrically conductive layers by electroplating techniques and patterning using batch process lithography. The electrically conductive layers are separated by insulating layers. Such a packaging technique can support high density interconnect routing, can minimize package area by reducing the distance between die contact and package ball grid array or pads, can improve power efficiency, and so forth.

Semiconductor dies can generate significant heat during operation. Semiconductor device packaging of some semiconductor dies has been problematic because the molding compound that encapsulates a semiconductor die cannot effectively dissipate heat generated by the semiconductor die. This trapped heat can cause poor performance and/or failure of the semiconductor device. Heat buildup can be exacerbated in semiconductor packages having multiple electrically conductive layers separated by insulating layers, such as in an RCP semiconductor package, because heat dissipation is limited by the relatively long interconnect routing within the RCP interconnect layers and by the metal structure (e.g., metal thickness and width).

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Embodiments of the present invention entail a semiconductor package having effective heat dissipation via thermal vias formed in the interconnect layers of the semiconductor package and methodology for forming the thermal vias. More particularly, thermal vias are formed in contact with the active face of a semiconductor die within a semiconductor package. The thermal vias extend through the multiple interconnect layers of the semiconductor package, and heat can be dissipated directly from the semiconductor dies without restriction by the metal structures of the interconnect layers.

Figure 1:
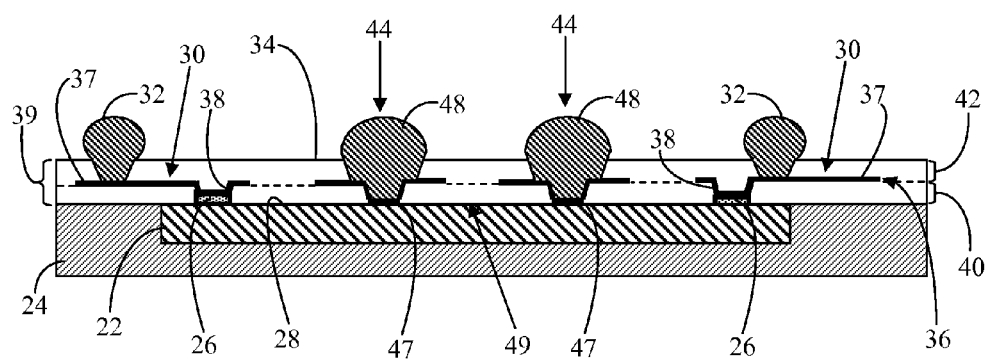
FIG. 1 shows a side view of a semiconductor package in accordance with an embodiment.

FIG. 1 shows a side view of a semiconductor package 20 in accordance with an embodiment. Semiconductor package 20 includes one or more singulated semiconductor dies 22 embedded in a molding compound 24 with die electrical contacts, i.e., bond pads 26, on an active face 28 of semiconductor dies 22. Electrical interconnects 30 extend from bond pads 26 on active face 28 to conductive elements 32 exposed on an exterior surface 34 of semiconductor package 20. More particularly, electrical interconnects 30 may formed from an electrically conductive layer 36 suitably patterned to produce traces 37 and vias 38 that extend through a layered arrangement 39 of insulating dielectric layers 40, 42 to interconnect with conductive elements 32, which may be solder balls, at exterior surface 34 of semiconductor package. In FIG. 1, and in subsequent illustrations, the various dielectric layers, e.g., dielectric layers 40, 42, will be distinguished from one another in their respective layered arrangement, e.g., layered arrangement 39, using dashed lines.

Patterning of electrically conductive layer 36, sometimes referred to as a metal layer, to produce traces 37 and vias 38 enables an array or arrays of bond pads 26 on active face 28 of semiconductor dies 22 to be redistributed geometrically, so that the array of conductive elements 32 at exterior surface 34 may have a different geometry from the geometry of bond pads 26 on semiconductor dies 22. In this example, exterior surface 34 of semiconductor package 20 is the exposed exterior of the topmost dielectric layer, i.e., dielectric layer 42. It should be noted that different components of semiconductor package 20 are illustrated variously to include hatching or stippling in order to more clearly distinguish the components.

The exemplary semiconductor package 20 shown in FIG. 1 and semiconductor packages shown in FIGS. 2 and 5-7 include only one semiconductor die 22 for simplicity of illustration. Additionally, the exemplary semiconductor package 20 shown in FIG. 1 and the semiconductor packages shown in FIGS. 2 and 5-7 include only a few bond pads, conductive elements, electrical interconnects, and dielectric layers for simplicity of illustration. It should be appreciated that a semiconductor package, such as those illustrated herein, may include more than one semiconductor die 22 that may be interconnected with one another, and may be connected with multiple conductive elements at the exterior surface of the semiconductor package. Furthermore, a semiconductor package may include more electrically conductive layers and dielectric layers, examples of which will be shown in subsequent embodiments.

Electrical interconnects 30 can provide a path for the dissipation of heat generated by semiconductor die 22. Unfortunately, effective heat dissipation can be limited by the length of the path (i.e., routing) of electrical interconnects 30, as well as by the metal structure (e.g., metal thickness and width) of electrical interconnects 30. To enhance heat dissipation in accordance with an embodiment, semiconductor package 20 further includes one or more thermal vias 44 extending through dielectric layers 40, 42 from active face 28 of semiconductor die 22 to exterior surface 34 of semiconductor package 20. Thermal vias 44 enable the dissipation of heat directly from semiconductor die 22 without restriction of the metal structure of electrical interconnects 30. Thus, thermal vias 44 can serve as a supplement to electrical interconnects 30 for providing effective heat dissipation.

As will be discussed in greater detail below, each of dielectric layers 40, 42 includes openings 46 (see FIG. 3) that are formed during processing. Openings 46 extend from active face 28 to exterior surface 34 of the outermost dielectric layer 42. Electrically conductive layer 36 may be suitably formed in openings 46 to be in physical contact with active face 28 of semiconductor die 22. In the illustrated embodiment, a portion 47 of electrically conductive layer 36 is in contact with active face 28 at locations that do not include bond pads 26 (e.g., the polyimide or passivation of semiconductor die 22). As such, portions 47 of electrically conductive layer 36 are formed in openings 46 and are in direct physical contact with a non-bond pad area 49 of active face 28 of semiconductor die 22, where non-bond pad area 49 is defined by an absence of bond pads 26.

A thermally conductive material 48 fills openings 46 to form thermal vias 44. Thermally conductive material 48 has a thermal capacity or transfer coefficient greater, or even much greater, than the thermal capacity or transfer coefficient of electrical interconnects 30 and/or of dielectric layers 40 and 42. In some embodiments, thermally conductive material 48 may be the same material, e.g., solder, used to form conductive elements 32. As such, conductive elements 32 as well as thermally conductive material 48 that forms thermal vias 44 are represented in FIG. 1 by rightwardly and downwardly directed narrow hatching. Other embodiments may incorporate a different thermally conductive material 48 than the material used to form conductive elements 32.

In general, thermal vias 44 provide a direct path for heat dissipation from semiconductor die 22 to exterior surface 34 of semiconductor package 20. When semiconductor package 20 is flipped and electrical elements 32 are soldered to a substrate, for example, a printed circuit board, the heat dissipated from semiconductor die 22 can be effectively conducted toward the printed circuit board by way of thermal vias 44. The illustrated embodiment includes two thermal vias 44 laterally displaced from one another. Other embodiments may include one or more than two thermal vias 44 in accordance with a particular semiconductor die size and quantity, semiconductor package size, a desired heat dissipation capacity, and so forth.

Figure 2:
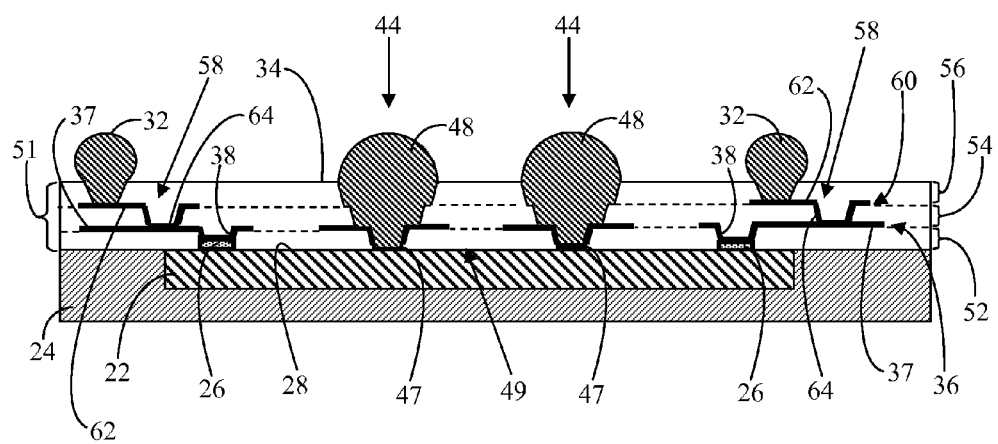
FIG. 2 shows a side view of a semiconductor package in accordance with another embodiment.

FIG. 2 shows a side view of a semiconductor package 50 in accordance with another embodiment. Semiconductor package 50 can include components similar to those described in connection with semiconductor package 20 (FIG. 1). For example, semiconductor package 50 includes semiconductor die 22 embedded in molding compound 24, electrical bond pads 26 on active face 28 of semiconductor die 22, and conductive elements 32 exposed on exterior surface 34 of semiconductor package 50.

This example includes a layered arrangement 51 of three insulating dielectric layers 52, 54, 56 (delineated by dashed lines) with electrical interconnects 58 extending though dielectric layers 52, 54, 56 from bond pads 26 to conductive elements 32 exposed on exterior surface 34 of semiconductor package 50. In the illustrated embodiment, electrical interconnects 58 are formed from two electrically conductive layers 36, 60. More particularly, electrical interconnects 58 may include electrically conductive layer 36 suitably patterned to form traces 37 and vias 38 that extend through dielectric layer 52. Electrical interconnects 58 may further include electrically conductive layer 60 that is in contact with electrically conductive layer 36. Electrically conductive layer 60 is suitably patterned to form traces 62 and vias 64 that extend through dielectric layer 54. As shown, conductive elements 32 are in contact with traces 62 through dielectric layer 56.

Thermal vias 44 may be formed to extend through each dielectric layer from dielectric layer 52 disposed on active face 28 of semiconductor die 22, through one or more intervening dielectric layers, e.g., dielectric layer 54, and through the outermost dielectric layer 56 to exterior surface 34. Again, portions 47 of electrically conductive layer 36 are formed in physical contact with non-bond pad area 49 of active face 28 within openings 46.

Figure 3:
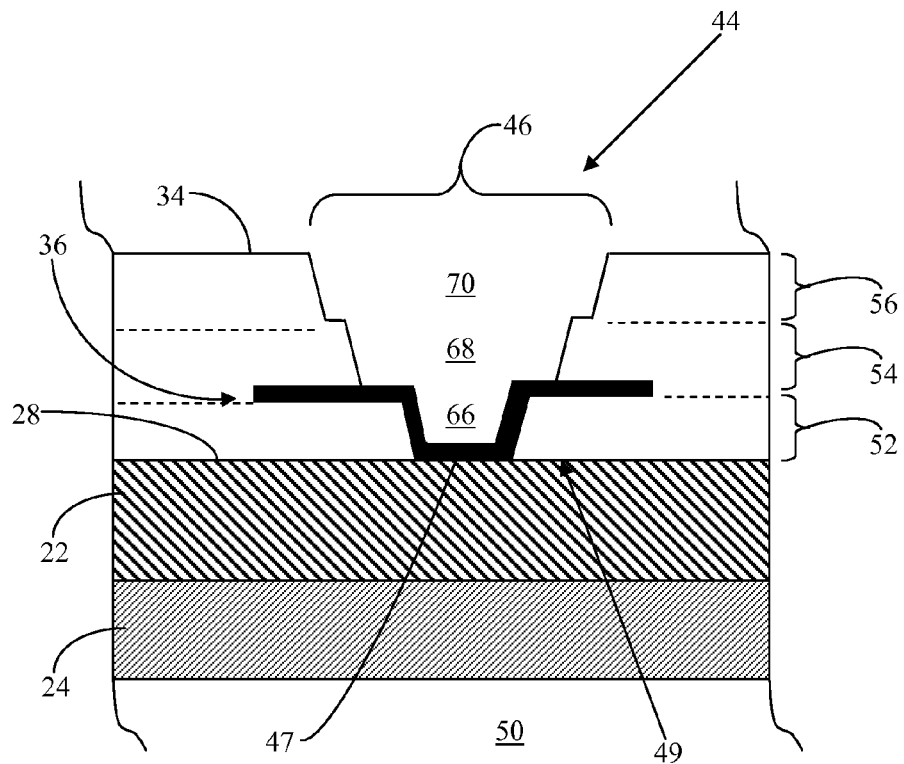
FIG. 3 shows an enlarged side view of a portion of the semiconductor package of FIG. 2.

Referring to FIG. 3 in connection with FIG. 2, FIG. 3 shows an enlarged side view of a portion of semiconductor package 50. In particular, FIG. 3 shows a portion of semiconductor package 50 at which one of thermal vias 44 is located. However, thermally conductive material 48 is absent in order to better visualize one of openings 46 extending through dielectric layers 52, 54, 56. In an embodiment, opening 46 includes a first opening 66 extending through dielectric layer 52, a second opening 68 extending through dielectric layer 54, and a third opening 70 extending through dielectric layer 56. Collectively, openings 66, 68, and 70 form opening 46 extending from active face 28 of semiconductor die 22 to exterior surface 34 of semiconductor package 52.

Openings 66, 68, and 70 are in stacked alignment relative to one another in dielectric layers 52, 54, and 56. That is, dielectric layers 52, 54, and 56 are formed in succeeding order one above the next, as shown in the orientation of FIG. 3. Additionally, openings 66, 68, and 70 are aligned with one another in dielectric layers 52, 54, and 56.

Figure 4:
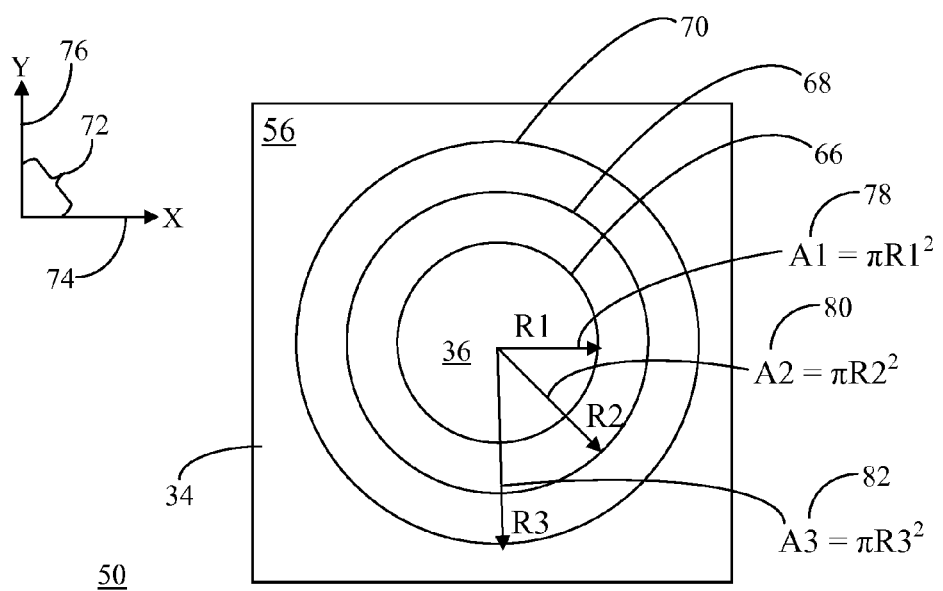
FIG. 4 shows an enlarged top schematic view of the portion of the semiconductor package shown in FIG. 3.

Referring jointly to FIGS. 3 and 4, FIG. 4 shows an enlarged top schematic view of the portion of semiconductor package 50 shown in FIG. 3. In particular, FIG. 4 exemplifies a size relationship between openings 66, 68, and 70. Active face 28 of semiconductor die 22 is oriented approximately parallel to an X-Y plane 72 in a three-dimensional Cartesian coordinate system. In an example, active face 28 extends in two directions, i.e., approximately parallel to an X-axis 74 and approximately parallel to a Y-axis 76, that define X-Y plane 72.

First opening 66, disposed on active face 28 of semiconductor die 22, exhibits a cross-sectional area 78, labeled A1, in a direction parallel to active face 28, i.e., in X-Y plane 72. Additionally, second opening 68 aligned with first opening 66 exhibits a cross-sectional area 80, labeled A2, in X-Y plane 72, and third opening 70 aligned with first and second openings 66, 68 exhibits a cross-sectional area 82, labeled A3, in X-Y plane 72. In some embodiments, openings 66, 68, and 70 may be generally circular. As such, each of cross-sectional areas 78, 80, and 82 is defined by the well known equation for the area of a circle, i.e., $\pi R^2$, where R1 is the radius of opening 66, R2 is the radius of opening 68, and R3 is the radius of opening 70 in FIG. 4.

In accordance with an embodiment, cross-sectional area 80, 82, of each successive opening 68, 70 from first opening 66 is larger than cross-sectional area 78, 80 of the preceding opening 66, 68. That, is cross-sectional area 80 of second opening 68 is larger than cross-sectional area 78 of first opening 66. Likewise cross-sectional area 82 of third opening 70 is larger than cross-sectional area 80 of second opening 68. As such, each successive opening 66, 68, 70 from active face 28 of semiconductor die 22 can contain an increasingly larger volume of thermally conductive material 48 for more effective heat dissipation.

Although some embodiments include the increasingly larger openings, other embodiments may have openings that are all generally of the same cross-sectional area. In addition, openings 66, 68, and 70 are illustrated as having circular cross-sections. However, other embodiments may be square, rectangular, or any other suitable shape.

Figure 5:
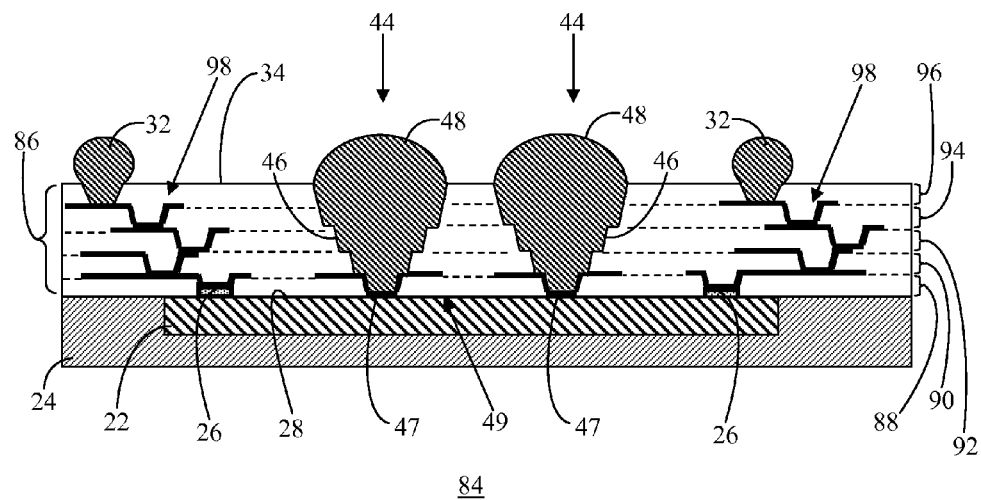
FIG. 5 shows a side view of a semiconductor package in accordance with another embodiment.

FIG. 5 shows a side view of a semiconductor package 84 in accordance with another embodiment. Again, semiconductor package 84 can include components similar to those described in connection with semiconductor package 20 (FIG. 1). For example, semiconductor package 84 includes semiconductor die 22 embedded in molding compound 24, electrical bond pads 26 on active face 28 of semiconductor die 22, and conductive elements 32 exposed on exterior surface 34 of semiconductor package 84. This example includes a layered arrangement 86 of five insulating dielectric layers 88, 90, 92, 94, 96 with electrical interconnects 98 extending though dielectric layers 88, 90, 92, 94, 96 from bond pads 26 to conductive elements 32 exposed on exterior surface 34 of semiconductor package 84.

Thermal vias 44 may be formed to extend through each dielectric layer from dielectric layer 88 disposed on active face 28 of semiconductor die 22, through one or more intervening dielectric layers, e.g., dielectric layers 90, 92, 94, and through the outermost dielectric layer 96 to exterior surface 34. Again, portions 47 of electrically conductive layer 36 are formed in physical contact with non-bond pad area 49 of active face 28 within openings 46. As generally shown in FIG. 5 (and discussed in detail in connection with FIG. 4), the cross-sectional areas of each successive opening in each successive dielectric layer 90, 92, 94, 96 that forms openings 46 are larger than the cross-sectional areas of the preceding opening 88, 90, 92, 94. Thus, each successive opening from active face 28 of semiconductor die 22 can contain an increasingly larger volume of thermally conductive material 48 for more effective heat dissipation.

Figure 6:
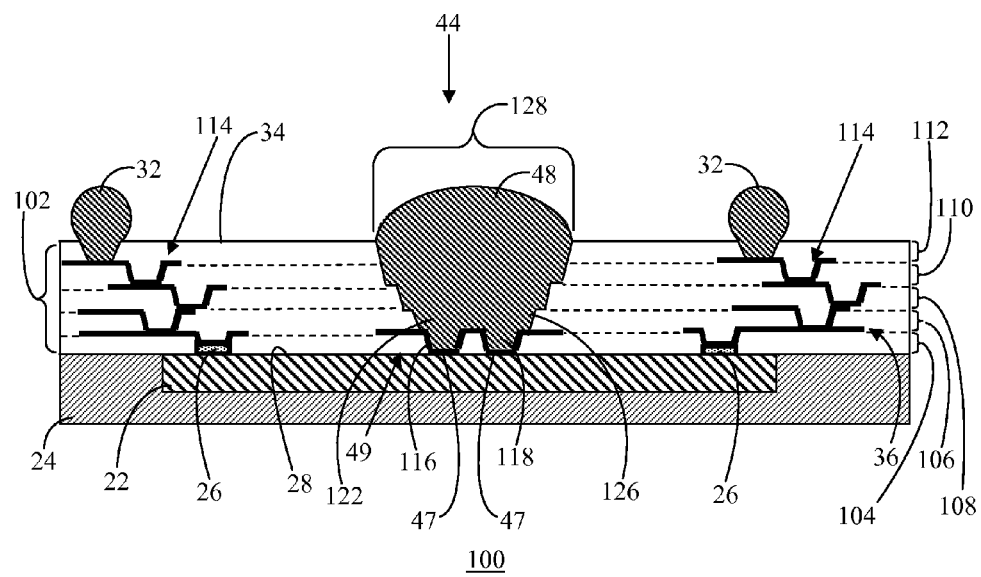
FIG. 6 shows a side view of a semiconductor package in accordance with another embodiment.

FIG. 6 shows a side view of a semiconductor package 100 in accordance with another embodiment. Semiconductor package 100 includes semiconductor die 22 embedded in molding compound 24, electrical bond pads 26 on active face 28 of semiconductor die 22, and conductive elements 32 exposed on exterior surface 34 of semiconductor package 100. This example includes a layered arrangement 102 of five insulating dielectric layers 104, 106, 108, 110, 112 with electrical interconnects 114 extending though dielectric layers 104, 106, 108, 110, 112 from bond pads 26 to conductive elements 32 exposed on exterior surface 34 of semiconductor package 100. A thermal via 44 is formed extending through dielectric layers 104, 106, 108, 110, 112 from active face 28 of semiconductor die 22 to exterior surface 34 of semiconductor package 100.

Semiconductor package 100 includes a first opening 116 and a second opening 118 formed in dielectric layer 104 disposed on active face 28. In this example, a third opening 122, generally aligned with first opening 116, in dielectric layer 106 is merged with a fourth opening 126, generally aligned with second opening 118, in dielectric layer 106 to form a continuous opening 128 in dielectric layer 106. Likewise, the openings in each successive dielectric layer 108, 110, 112 are also merged to increase the size of continuous opening 128. Thus, when continuous opening 128 is filled with thermally conductive material 48 (as shown in FIG. 6) to form thermal via 44, greater heat dissipation capacity can be achieved.

Figure 7:
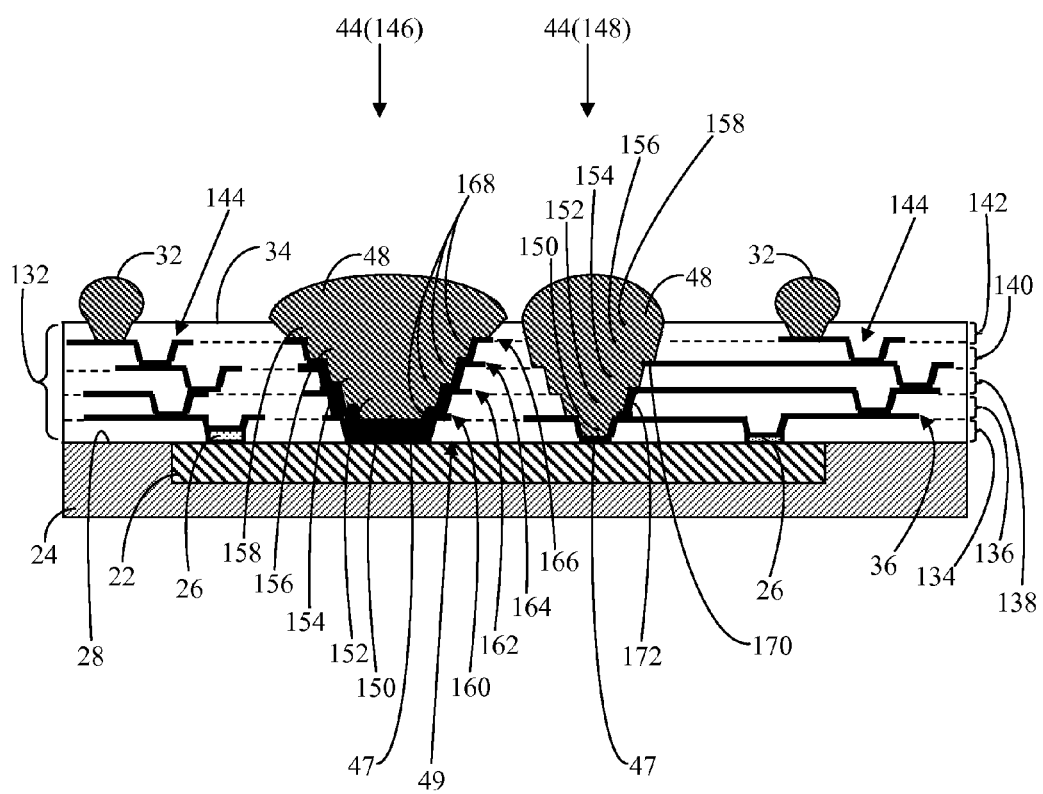
FIG. 7 shows a side view of a semiconductor package in accordance with another embodiment.

FIG. 7 shows a side view of a semiconductor package 130 in accordance with another embodiment. Semiconductor package 130 includes semiconductor die 22 embedded in molding compound 24, electrical bond pads 26 on active face 28 of semiconductor die 22, and conductive elements 32 exposed on exterior surface 34 of semiconductor package 130. This example includes a layered arrangement 132 of five insulating dielectric layers 134, 136, 138, 140, 142 with electrical interconnects 144 extending though dielectric layers 134, 136, 138, 140, 142 from bond pads 26 to conductive elements 32 exposed on exterior surface 34 of semiconductor package 130. Thermal vias 44 are formed extending through dielectric layers 134, 136, 138, 140, 142 from active face 28 of semiconductor die 22 to exterior surface 34 of semiconductor package 130.

Semiconductor package 130 demonstrates two additional configurations for thermal vias 44. In this example, the two additional thermal via configurations are referred to by different reference numbers and are individually described for clarity of discussion. One thermal via 44 is referred to hereinafter as a thermal via 146, and another thermal via 44 is referred to hereinafter as a thermal via 148.

In this example, thermal via 146 is formed by making successive openings 150, 152, 154, 156, 158 through each of dielectric layers 134, 136, 138, 140, 142. Electrically conductive layers 160, 162, 164, 166 are formed between dielectric layers 134, 136, 138, 140. As electrically conductive layers 160, 162, 164, 166 are deposited and patterned on the respective dielectric layers 134, 136, 138, 140, one or all of the side walls 168 of successive openings 150, 152, 154, 156, 158 are lined with the electrically conductive layers 160, 162, 164, 166. The material used for conductive layers 160, 162, 164, 166 may be, for example, copper. By lining side walls 168 with copper, thermally conductive material 48, e.g., solder, can more readily adhere to side walls 168.

In some embodiments, it may be useful to couple a thermal via with other routing at any electrically conductive layer, e.g., metal layer. Such a structural configuration could be useful to dissipate some heat from hot spots within the routing. This structural configuration is demonstrated by thermal via 148. As shown, electrical interconnect 144 may be in physical contact with thermally conductive material 48 of thermal via 148. By way of example, a finger 170 of electrically conductive layer 164 may contact thermal via 148. In another example, a finger 172 of electrically conductive material 162 may line side wall 168 of one of the openings, e.g., opening 152, used to form thermal via 148. Thus, when openings 150, 152, 154, 156, 158 are filled with thermally conductive material 48, electrical interconnect 144 (formed from suitably patterned electrically conductive layers 160, 162, 164, 166) will physically contact thermal via 146 to provide heat dissipation at a hot spot. Thermal via 148 shows two techniques for providing the physical contact between electrical interconnect 144 and thermal via 148. However, other structural configurations are possible.

Figure 8:
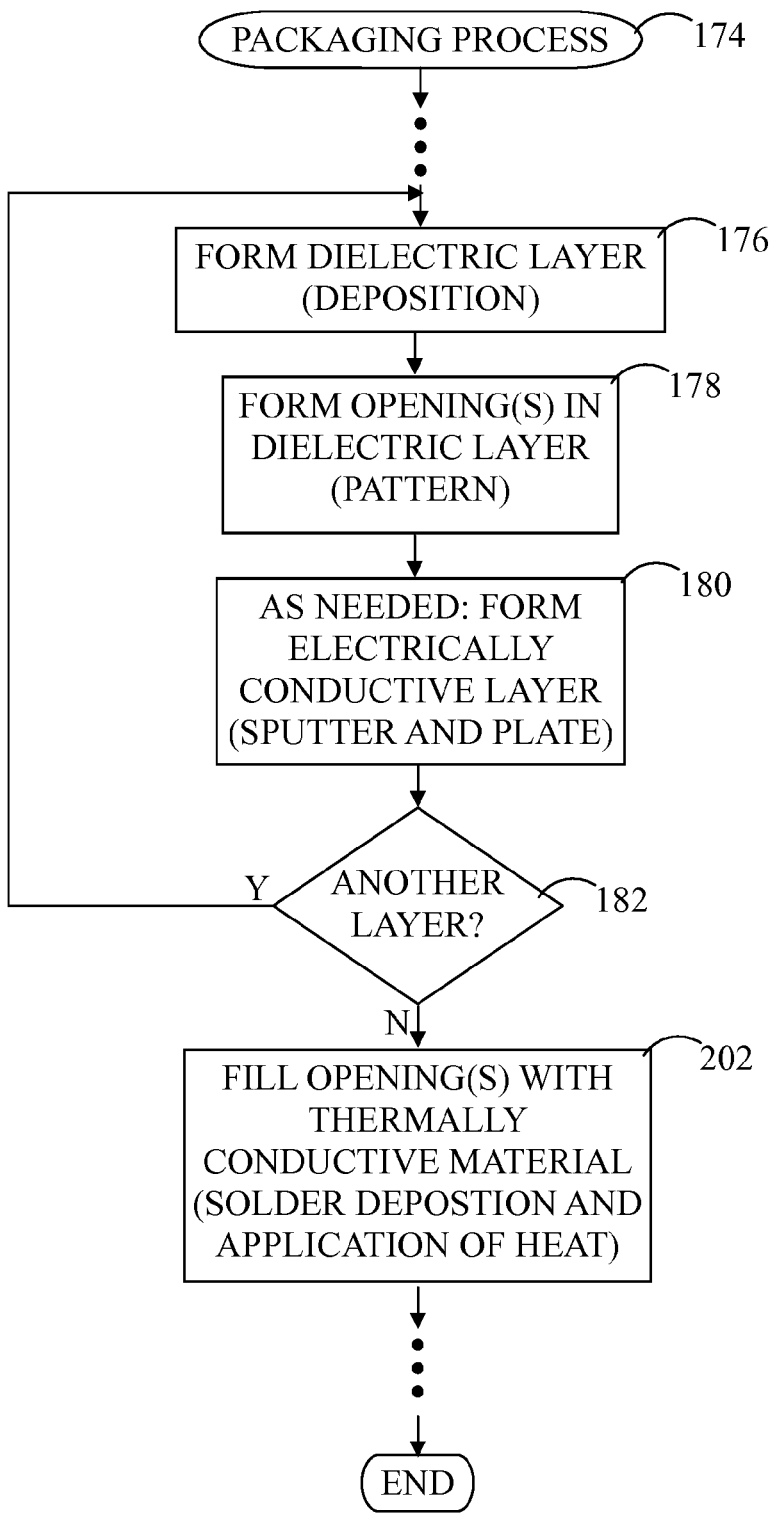
FIG. 8 shows a flowchart of a packaging process in accordance with another embodiment.

FIG. 8 shows a flowchart of a packaging process 174 in accordance with another embodiment. Packaging process 174 may be executed to provide any of semiconductor packages 20 (FIG. 1), 50 (FIG. 2), 84 (FIG. 5), 100 (FIG. 6), and 130 (FIG. 7) described above. More particularly, packaging process 174 may be executed to provide suitable thermal vias 44 in such a semiconductor package 20, 50, 84, 100, and 130 during buildup of the electrically conductive layers and the dielectric layers in a redistribution process for routing signal, power, and ground connections. For purposes of explanation, packaging process 174 will be described in connection with the processing of semiconductor package 50 shown in FIG. 2.

Packaging process 174 generally begins with a series of operations that may entail manufacturing semiconductor die 22, embedding semiconductor die 22 within molding compound 24 to form a panel of semiconductor dies, and so forth. These details are represented by ellipses and are not described herein for brevity. Packaging process 174 further entails forming (176) dielectric layer 52 over active face 28 of semiconductor die, e.g., deposition, forming (178) openings 66 in dielectric layer 52, e.g., pattern, and forming (180) electrically conductive layer 36 over dielectric layer 52, e.g., sputter and plate, and repeating these processes (176, 178, 180) as needed to get predetermined layered arrangement 39 (see FIG. 2), as represented by a decision block (182).

Figure 9:
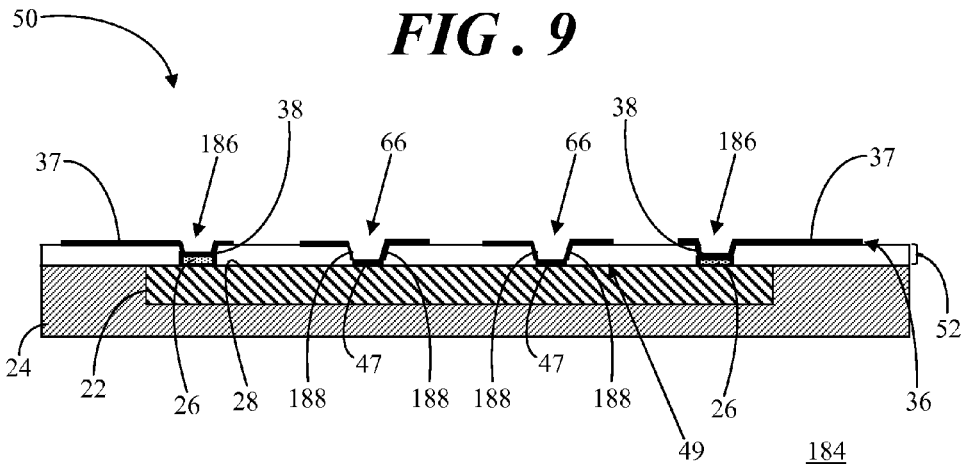
FIG. 9 shows a side view of the semiconductor package of FIG. 2 at an intermediate stage of processing in accordance with the packaging process.

Referring to FIG. 9 in connection with processes 176, 178, and 180, FIG. 9 shows a side view of semiconductor package 50 at an intermediate stage 184 of processing in accordance with packaging process 174. As shown, dielectric layer 52 is disposed over active face 28 of semiconductor die 22. Openings 66 are formed in dielectric layer 52. Additionally, openings 186 are formed in dielectric layer 52, at the sites where vias 38 for electrical interconnects 58 (of FIG. 2) are to be formed. After openings 66 and 186 are formed in dielectric layer 52, electrically conductive layer 36 is formed over dielectric layer 52 and in openings 66 and 186.

Formation of electrically conductive layer 36 may entail a sputter and plate process. Sputter and plate processes are well-known in thin film technology. Briefly, a seed layer (for example TiW) may be applied on dielectric layer 52. Next, a photoresist layer may be deposited on the seed layer and structured by photolithography to form trenches in the photoresist layer. Subsequently, electro-plating, e.g., copper, may be used to fill these trenches in order to generate traces 37 on layer 52 for electrical interconnects 58. Of course, during this process, the electro-plating, e.g., the copper, is additionally deposited within openings 186 to form vias 38 that are in contact with electrical bond pads 26. Additionally, the electro-plating, e.g., copper, is deposited within openings 66 so that portion 47 of electrically conductive layer 36 is in physical contact with non-bond pad area 49 of active face 28 within openings 66. This electrically conductive layer 36 may additionally line side walls 188 of openings 66.

Figure 10:
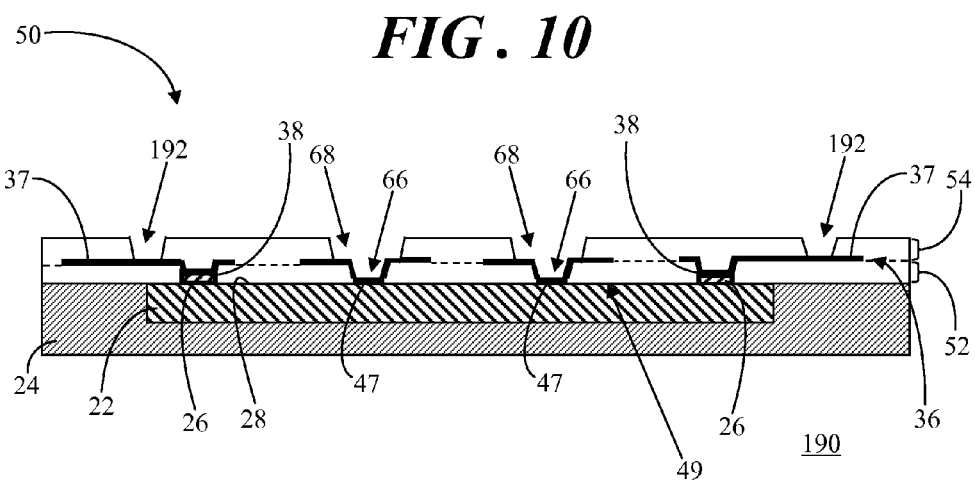
FIG. 10 shows a side view of the semiconductor package from FIG. 9 during a subsequent stage of processing.

FIG. 10 shows a side view of semiconductor package 50 from FIG. 9 during a subsequent stage 190 of processing (repeating 176, 178 of process 174 in FIG. 8). At stage 190, dielectric layer 54 has been deposited over dielectric layer 52 and over electrically conductive layer 36. Additionally, openings 68 are formed at the sites for thermal vias 44 (of FIG. 2), and openings 192 are formed at the sites where vias 64 for electrical interconnects 58 are to be formed. In some embodiments, when dielectric layer 54 is deposited over dielectric layer 52 and electrically conductive layer 36, dielectric layer 54 may at least partially fill the preexisting openings 66. Thus, openings 66 may need to be reformed to expose conductive layers 36 within openings 66. Alternatively, openings 66 may be suitably masked so that the dielectric layer 54 will not be deposited within openings 66.

Figure 11:
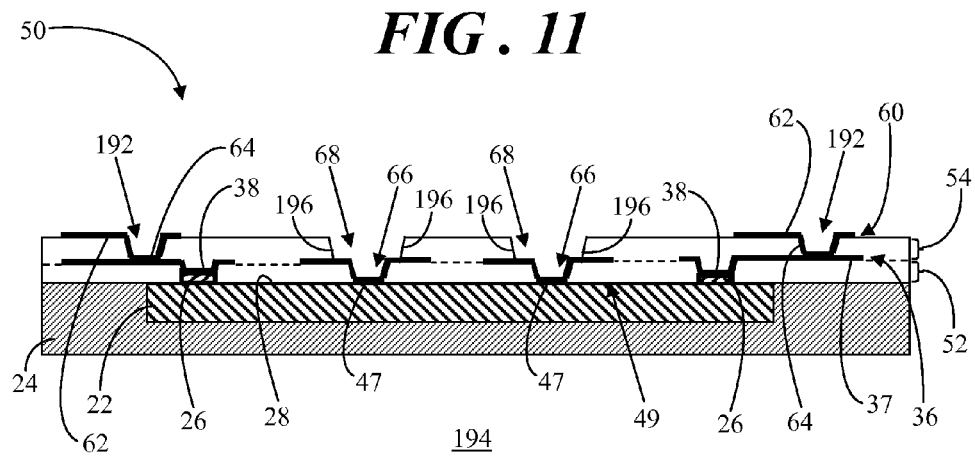
FIG. 11 shows a side view of the semiconductor package from FIG. 10 during a subsequent stage of processing.

FIG. 11 shows a side view of semiconductor package 50 from FIG. 10 during a subsequent stage 194 of processing (repeating 180 of process 174 in FIG. 8). That is, electrically conductive layer 60 is formed over dielectric layer 54 by, for example, a sputter and plate process to form traces 62 over dielectric layer 54 and to form vias 64 in dielectric layer 54 for electrical interconnects. In the illustrated embodiment, electrically conductive layer 60 is not formed in openings 68 and does not line side walls 196 of openings 68. However, in other embodiments such as thermal via 146 (in FIG. 6), electrically conductive layer 60 may be plated to line side walls 196 of openings 68.

Figure 12:
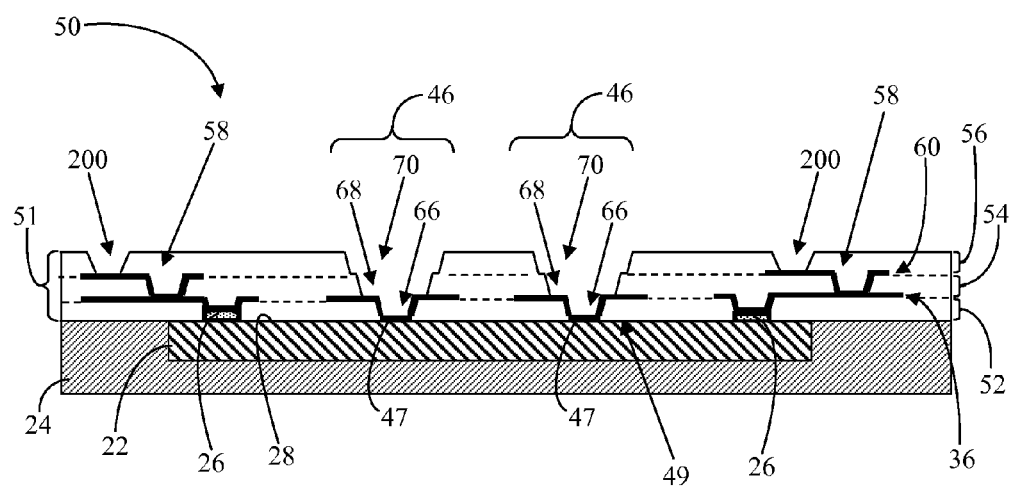
FIG. 12 shows a side view of the semiconductor package from FIG. 11 during a subsequent stage of processing.

FIG. 12 shows a side view of semiconductor package 50 from FIG. 11 during a subsequent stage 198 of processing (again repeating 176, 178 of process 174 in FIG. 8). At stage 198, dielectric layer 56 has been deposited over dielectric layer 54 and over electrically conductive layer 60 to produce layered arrangement 51. Additionally, openings 70 are formed at the sites for thermal vias 44, and openings 200 are formed at the sites where conductive elements 32 (see FIG. 2) are to be formed for connection to electrical interconnects 58. The combination of openings 66, 68, 70 formed in succeeding dielectric layers 52, 54, 56 produces openings 46 extending from active face 28 of semiconductor die 22 to exterior surface 34 of semiconductor package 50 at dielectric layer 56.

Now returning to FIG. 8, following formation of the dielectric layers and the electrically conductive layers (176, 178, 180, and 182), the openings are filled (202) with thermally conductive material 48 (see FIG. 2) via solder deposition and application of heat to melt thermally conductive material 48 and enable a flow of the liquefied thermally conductive material 48 into the openings. Thereafter, packaging process 174 may include additional processes such as device testing, panel dicing, and so forth. These additional processes are represented by ellipses and are not described herein for brevity.

Figure 13:
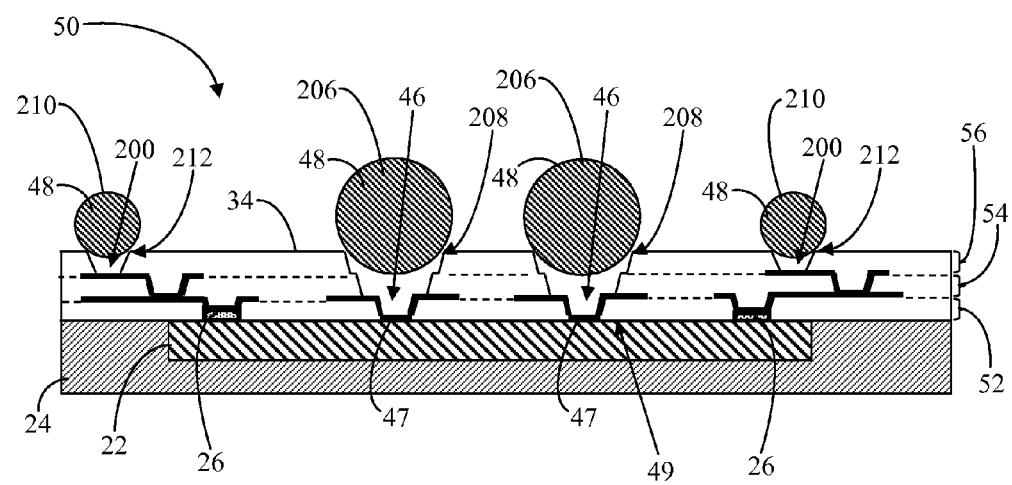
FIG. 13 shows a side view of the semiconductor package from FIG. 12 during a subsequent stage of processing.

FIG. 13 shows a side view of semiconductor package 50 from FIG. 12 during a subsequent stage 204 of processing. As shown, a solder ball 206, or sphere, of thermally conductive material 48 is placed at an entrance 208 of each opening 46 at exterior surface 34. Additionally, a solder ball 210, or sphere, of thermally conductive material 48 is placed at an entrance 212 of each opening 200 at exterior surface 34. A volume of each solder ball 206, 210 may be appropriately selected to compensate for the needed volume of thermally conductive material 48 in openings 46 and 200. That is, openings 46 extend through three dielectric layers 52, 54, 56 and get larger from dielectric layer 52, through the intervening dielectric layer 54, and through dielectric layer 56. Conversely, openings 200 merely extend through a single dielectric layer 56.

Accordingly, more thermally conductive material 48 will be required in order to fill openings 46 than to fill openings 200.

Solder balls 206, 210 may subsequently be heated by known processes in order to melt the thermally conductive material 48. The melted, or liquefied, thermally conductive material 48 can then flow into and fill openings 46 in order to concurrently fill all openings 66, 68, 70 of openings 46 to form thermal vias 48 and to concurrently fill openings 200 to form conductive elements 32 that are electrically connected to electrical interconnects 58, as exemplified in FIG. 2.

It is to be understood that certain ones of the process blocks depicted in FIG. 8 may be performed in parallel with each other or with performing other processes. In addition, it is to be understood that the particular ordering of the process blocks depicted in FIG. 8 may be modified, while achieving substantially the same result. Accordingly, such modifications are intended to be included within the scope of the inventive subject matter. In addition, although particular structural configurations are described in conjunction with FIGS. 1-7, above, embodiments may be implemented in semiconductor packages having other architectures, as well. These and other variations are intended to be included within the scope of the inventive subject matter.

An embodiment of semiconductor package comprises a semiconductor die having an active face and at least one dielectric layer disposed on the active face of the semiconductor die. At least one opening is formed through the at least one dielectric layer, wherein the at least one opening extends from the active face to an exterior surface of the at least one dielectric layer. An electrically conductive layer is formed in the at least one opening, in which the electrically conductive layer is in physical contact with the active face, and a thermally conductive material fills the at least one opening to form a thermal via.

An embodiment of a method of forming a thermal via in a semiconductor package comprises forming an opening in a first dielectric layer disposed on an active face of a semiconductor die, the opening extending from the active face to an exterior surface of the first dielectric layer. The method further comprises forming an electrically conductive layer in the opening, the electrically conductive layer being in physical contact with the active face, and filling the opening with a thermally conductive material to form the thermal via.

Thus, various embodiments of a semiconductor package having effective heat dissipation and methodology for forming thermal vias in a semiconductor package have been described. More particularly, thermal vias are formed in contact with the active face of a semiconductor die within a semiconductor package. The thermal vias extend through the multiple interconnect layers of the semiconductor package, and heat can be dissipated directly from the semiconductor dies without restriction by the metal structures of the interconnect layers.

While the principles of the inventive subject matter have been described above in connection with specific apparatus and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A semiconductor package comprising:
    a semiconductor die having an active face, said active face including bond pads and a non-bond pad area defined by an absence of said bond pads;
    at least one dielectric layer disposed on said active face of said semiconductor die, wherein at least one opening is formed through said at least one dielectric layer, said at least one opening extending from said non-bond pad area of said active face to an exterior surface of said at least one dielectric layer;
    an electrically conductive layer formed in said at least one opening, said electrically conductive layer being in physical contact with said non-bond pad area of said active face; and
    a thermally conductive material filling said at least one opening to form a thermal via, wherein:
    said at least one dielectric layer comprises a first dielectric layer in physical contact with said active face of said semiconductor die and a second dielectric layer disposed in a layered arrangement with said first dielectric layer;
    said at least one opening comprises a first opening and a second opening laterally displaced away from said first opening in a direction parallel to said active face of said semiconductor die;
    said first and second openings extend through said first dielectric layer;
    said electrically conductive layer is formed in each of said first and second openings; and
    said at least one opening further comprises a third opening and a fourth opening extending through said second dielectric layer, said third opening being aligned with said first opening, and said fourth opening being aligned with said second opening.

2. The semiconductor package of claim 1 wherein said first opening exhibits a first cross-sectional area in a direction parallel to said active face of said semiconductor die, and said third opening exhibits a second cross-sectional area in said direction parallel to said active face of said semiconductor die, said second cross-sectional area being greater than said first cross-sectional area.

3. The semiconductor package of claim 1 wherein said electrically conductive layer is a first electrically conductive layer, and said semiconductor package further comprises a second electrically conductive layer lining a side wall of said third opening.

4. The semiconductor package of claim 1 wherein:
    said at least one dielectric layer further comprises intervening dielectric layers disposed between said first and second dielectric layers; and
    said at least one opening further comprises additional openings extending through said intervening dielectric layers, said additional openings being aligned with said first and third openings.

5. The semiconductor package of claim 4 wherein said first opening exhibits a first cross-sectional area in a direction parallel to said active face of said semiconductor die, and each successive one of said intervening openings and said third opening from said first opening exhibits said cross-sectional area that is larger than said cross-sectional area of each preceding one of said first opening and said intervening openings.

6. The semiconductor package of claim 1 wherein a first side wall of said third opening breaches a second side wall of said fourth opening to form a continuous opening in said second dielectric layer.

7. The semiconductor package of claim 1 wherein said thermal opening is not in physical contact with said bond pads on said active face.

8. The semiconductor package of claim 1 wherein said at least one opening has an entrance at said exterior surface of said second dielectric layer, and said thermally conductive material is configured to liquefy under application of heat to flow into said at least one opening from said entrance to said electrically conductive layer to form said thermal via.

9. The semiconductor package of claim 1 wherein said bond pads are laterally displaced away from said thermal via, and said semiconductor package further comprises an electrical interconnect extending from one of said bond pads through said at least one dielectric layer to a conductive element exposed on said exterior surface, said electrical interconnect being in physical contact with said thermal via.

10. A method of forming at least one thermal via in a semiconductor package comprising:

forming a first opening and a second opening in a first dielectric layer disposed on an active face of a semiconductor die, wherein said first and second openings are formed through said first dielectric layer from a non-bond pad area of said active face, said non-bond pad area being defined by an absence of bond pads, and said second opening is laterally displaced away from said first opening;

forming an electrically conductive layer in in each of said first and second openings, said electrically conductive layer being in physical contact with said non-bond pad area of said active face;

depositing another dielectric layer in a layered arrangement over said first dielectric layer;

forming a third opening in said another dielectric layer over said first opening;

forming a fourth opening in said another dielectric layer over said second opening; and concurrently filling said said first opening, second opening, third, and fourth openings with a thermally conductive material to form said at least one thermal via.

11. The method of claim 10 wherein a first side wall of said third opening breaches a second side wall of said fourth opening to form a continuous opening, and wherein said first opening, said second opening, and said continuous opening are concurrently filled with said thermally conductive material.

12. The method of claim 10 wherein said filling comprises:

depositing a volume of said thermally conductive material on said exterior surface at an entrance of said third and fourth openings; and applying heat to said thermally conductive material to liquefy said thermally conductive material to enable said thermally conductive material to flow into said first, second, third, and fourth openings from said entrance to said electrically conductive layer to form said at least one thermal via.

* * * * *